(12) United States Patent
An et al.

(10) Patent No.: US 8,617,314 B2
(45) Date of Patent: Dec. 31, 2013

(54) ORGANIC DEPOSITION APPARATUS AND METHOD OF DEPOSITING ORGANIC SUBSTANCE USING THE SAME

(75) Inventors: Young Ung An, Yongin-si (KR); Ki Taek Jung, Seoul (KR); Jong Yeoul Ji, Suwon-si (KR); Sang Leoul Kim, Osan-si (KR)

(73) Assignee: ADP Engineering Co., Ltd., Seongnam-Si, Gyeonggi-Do (KR)

( * ) Notice: Subject to any disclaimer, the term of this patent is extended or adjusted under 35 U.S.C. 154(b) by 893 days.

(21) Appl. No.: 12/255,160

(22) Filed: Oct. 21, 2008

(65) Prior Publication Data

US 2009/0258142 A1    Oct. 15, 2009

(30) Foreign Application Priority Data

Apr. 14, 2008    (KR) ........................ 10-2008-0034224

(51) Int. Cl.
   *C23C 16/00*    (2006.01)
(52) U.S. Cl.
   USPC .................. 118/729; 118/50; 118/58; 118/69; 427/248.1; 427/255.6; 427/8; 427/282; 427/294
(58) Field of Classification Search
   USPC .......... 427/255.6, 294, 292, 8, 248.1; 118/50, 118/729, 58, 69
   See application file for complete search history.

(56) References Cited

U.S. PATENT DOCUMENTS

| | | | |
|---|---|---|---|
| 2004/0083959 A1* | 5/2004 | Carpenter et al. | 118/715 |
| 2005/0011448 A1* | 1/2005 | Iwata | 118/715 |
| 2008/0260938 A1 | 10/2008 | Ikeda et al. | |

FOREIGN PATENT DOCUMENTS

| | | |
|---|---|---|
| JP | 2004-022400 | 1/2004 |
| JP | 2005-72196 | 3/2005 |
| JP | 2005-240121 | 9/2005 |
| JP | 2006-176809 | 7/2006 |
| KR | 10-2005-0010470 | 1/2005 |
| KR | 10-2005-0010746 | 1/2005 |

OTHER PUBLICATIONS

Machine translation of JP 2005-240121, Okada et al., Alignment Apparatus for Vacuum Deposition, Sep. 8, 2005.*
Machine translation of JP 2006-176809, Maehira et al., Method for Aligning Mask With Substrate, Method for Vapor-Depositing Organic Thin Film, and Aligning Device, Jul. 6, 2006.*
Machine translation of JP 2004-022400, Memesawa et al., Apparatus and Method for Forming Organic Film, Jan. 22, 2004.*
Chinese Office Action issued in CN Application No. 200810180037.1 dated Oct. 26, 2010 (full Chinese text and full English translation).

(Continued)

*Primary Examiner* — Queenie Dehghan
(74) *Attorney, Agent, or Firm* — KED & Associates, LLP

(57) ABSTRACT

An organic material deposition system and method are provided. The organic material deposition apparatus may include a chamber having a processing space formed therein, a source supply device that generates an organic source and injects and diffuses the organic source into the processing space through a shower head provided in the processing space. The substrate is supported by a stage device that moves the substrate upward and downward within the processing space to adjust a distance between the substrate and the shower head. A pumping port provided at an upper positioned at an upper portion of the processing space provides a vacuum exhaust path that directs flow through the processing space toward the stage device. This allows an organic thin film with a uniform thickness to be deposited using an apparatus with a relatively simple configuration.

14 Claims, 7 Drawing Sheets

(56) References Cited

OTHER PUBLICATIONS

Korean Office Action issued in KR Patent Application No. 10-2008-0034234 dated Sep. 28, 2010.
Korean Office Action issued in KR Application No. 10-2008-0034224 dated Mar. 4, 2010.
Taiwanese Office Action issued in TW Application No. 097144435 dated Jul. 5, 2012.
Chinese Office Action issued in CN Patent Application No. 2008101800371 dated Dec. 19, 2011.

* cited by examiner

US 8,617,314 B2

ORGANIC DEPOSITION APPARATUS AND METHOD OF DEPOSITING ORGANIC SUBSTANCE USING THE SAME

CROSS-REFERENCE TO RELATED PATENT APPLICATION

This application claims the benefit of Korean Patent Application No. 10-2008-0034224, filed in Korea on Apr. 14, 2008, the entirety of which is incorporated herein by reference.

BACKGROUND

1. Field

An organic deposition apparatus and a deposition method using the apparatus are provided, and more particularly, an organic deposition apparatus that deposits an organic thin film on a substrate and a deposition method using the apparatus are provided.

2. Background

The recent transition into an information based society has bolstered the significance of display technology that allows data to be accessed anytime and anywhere by displaying data in the forms of text and images that a user can visually perceive. Consumer trends in the display device market reflect an increased demand for flat panel devices, such as liquid crystal displays (LCD), plasma display panels (PDP), and organic electro-luminescent displays (organic light emitting diodes, OLED), due to the relatively large dimensions and substantial weight of older technology cathode ray tube (CRT) displays.

An LCD is a passive type device that uses a separate light source. LDSs have some technical limitations in terms of viewing angle, response time, contrast ratio, etc. A PDP may provide more favorable characteristics than an LCD in terms of viewing angle and response time. However, PDPs may be more difficult to miniaturize, consume more power, and be more expensive to manufacture.

An organic electroluminescent display (referred to hereinafter as an OLED) is self-luminous and thus does not require a separate light source. An OLED has lower power consumption, faster response time, little to no viewing angle limitations, and can realistically reproduce any type of moving image in miniature to large-screen formats. Also, the configuration of an OLED facilitates manufacturing, and can ultimately allow manufacture of an ultra-thin (1 mm or less in thickness) and an ultra light display. Further, research is underway to manufacture this type of display on a flexible substrate such as, for example, plastic in order to yield a thinner, lighter, and unbreakable flexible display. Improved manufacturing systems and methods, including those directed at the deposition of materials on substrates, will help advance the development of this technology.

BRIEF DESCRIPTION OF THE DRAWINGS

The embodiments will be described in detail with reference to the following drawings in which like reference numerals refer to like elements wherein.

DETAILED DESCRIPTION

An OLED may typically have a structure including an indium tin oxide (ITO) anode, an organic thin film, and a cathode electrode. An organic thin film may be formed of a single material, but may have a multilayer structure with a hole transport layer (HTL), an emitting layer (EML), an electron transport layer (ETL), etc. In an OLED having such a multilayer structure, holes may be supplied from the hole transport layer and electrons may be supplied from the electron transport layer, and the holes and electrons may be transferred to the emitting layer to form exitons of coupled hole-electrons, whereupon the exitons return to a ground state to discharge energy that emits light.

A vapor deposition (VD) method may be used for thin film deposition in the manufacturing of an OLED having a multilayer configuration. During vapor deposition, a source supply storing organic material may be heated to generate an organic source from the organic material, transport gas may be injected in the source supply, and the organic source may be supplied into a chamber in which a deposition process is performed. This type of deposition method may be classified into an upward, a downward, or a lateral method, based on a supplying position of the organic source.

The upward method involves positioning the substrate in an upper portion of the processing space, and discharging the organic source upward from the bottom of the processing space. The downward method involves positioning the substrate in a lower portion of the processing space, and discharging the organic source downward from the top of the processing space. The lateral method involves positioning the substrate at a lower portion of the processing space, and discharging the organic source from a side of the processing space onto the substrate positioned in the processing space.

Figure 1:
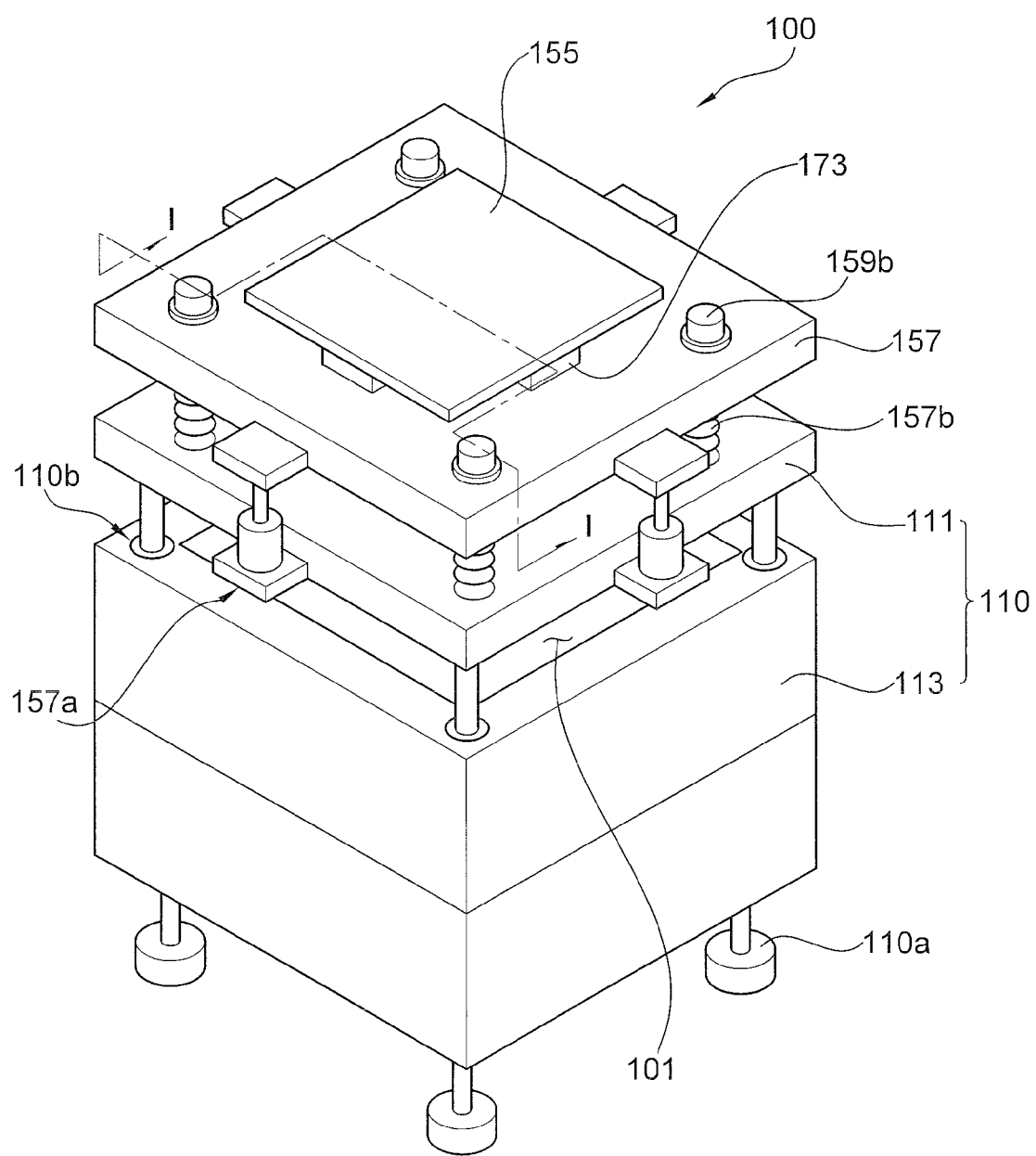
FIG. 1 is a perspective view of an organic material deposition apparatus as embodied and broadly described herein.
Figure 2:
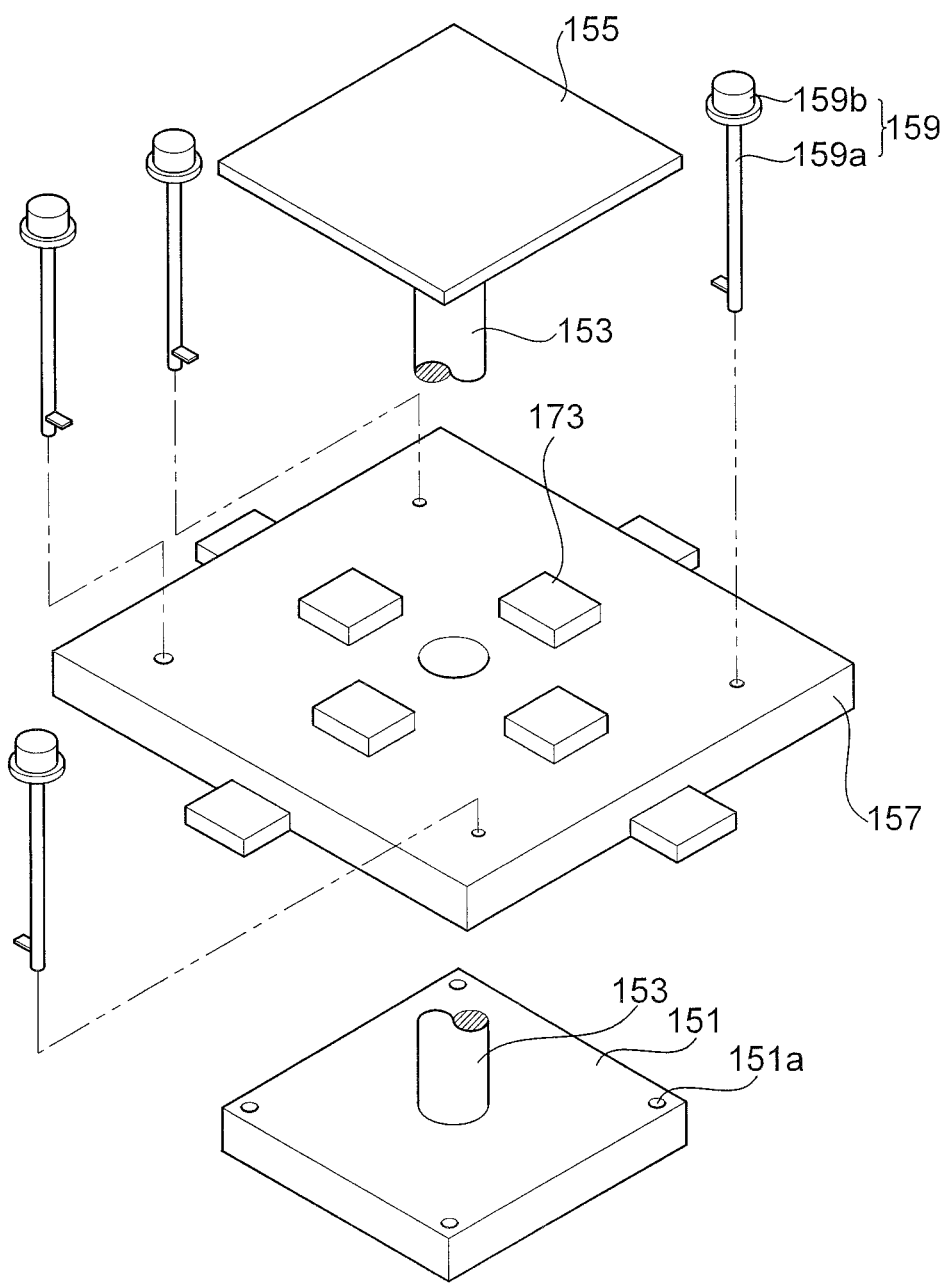
FIG. 2 is an exploded perspective view of a stage portion of the organic material deposition apparatus shown in FIG. 1.
Figure 3:
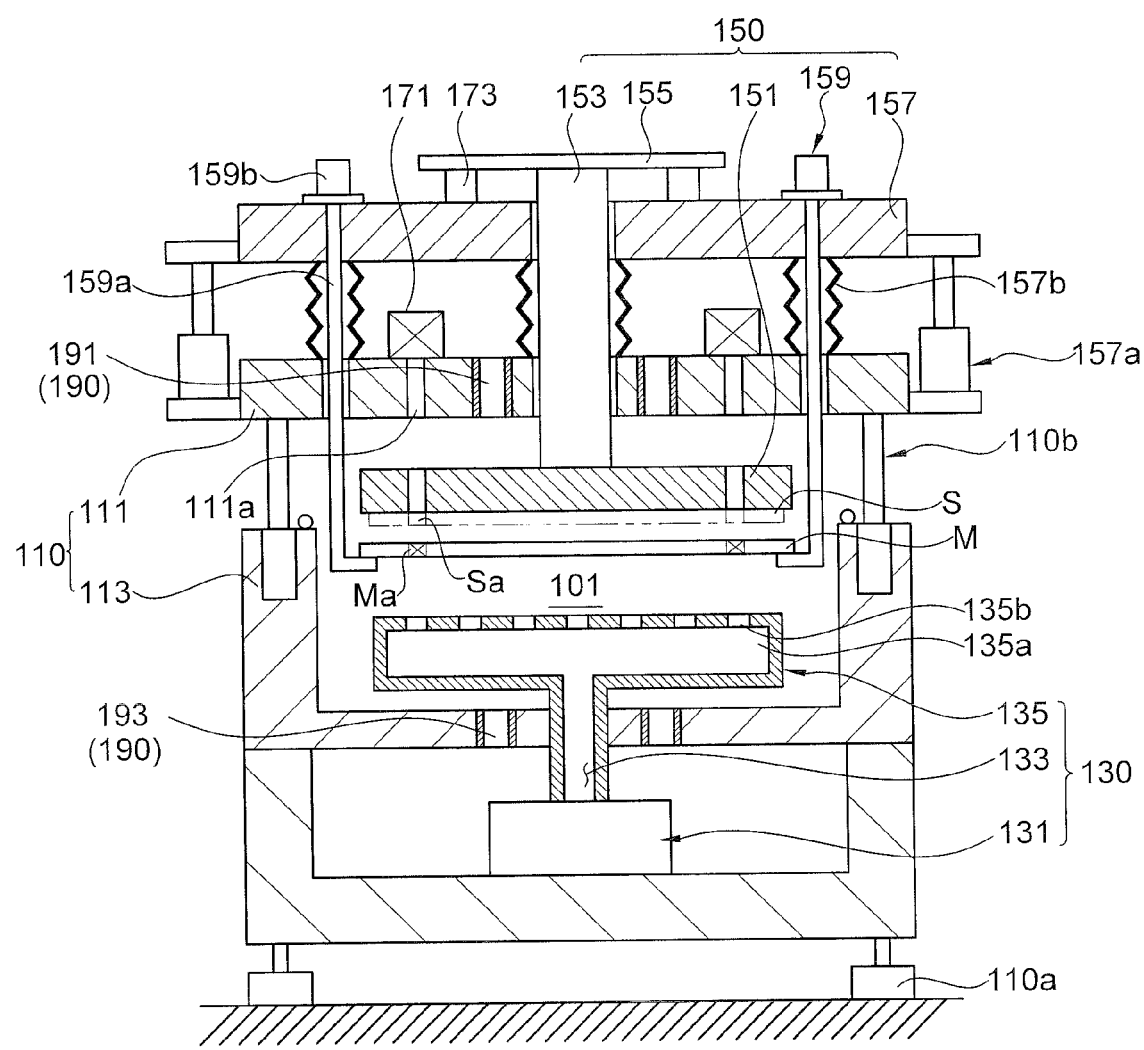
FIG. 3 is a sectional view of the organic material deposition apparatus shown in FIG. 1 taken along line I-I'.
Figure 4:
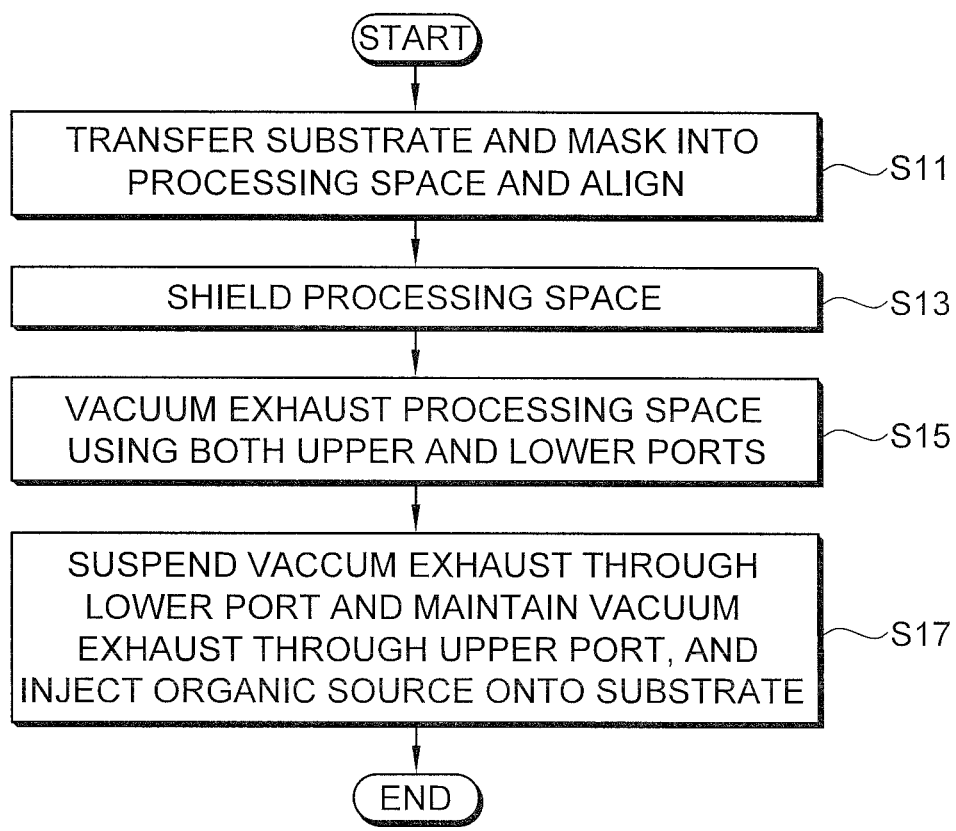
FIG. 4 is a flowchart of an organic material deposition method as embodied and broadly described herein.
Figure 5:
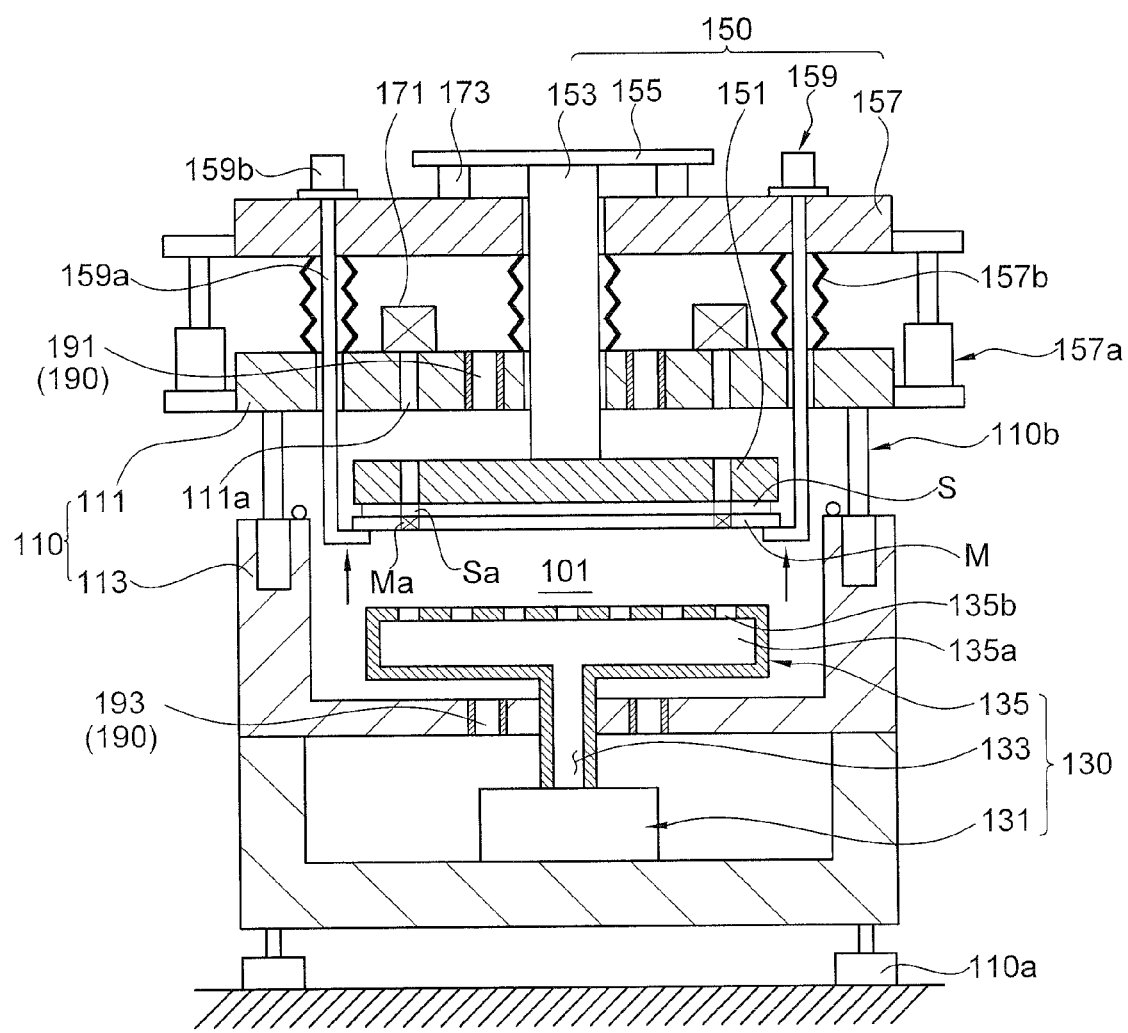
FIGS. 5 through 7 are operation diagrams illustrating the operation of an organic material deposition apparatus as embodied and broadly described herein.

Although these methods may be effective in deposition of a thin film, the upward method and the lateral method may rotate the substrate to attain a uniform thickness of a deposited thin film, thus making the structure of the apparatus more complex. These methods may also be difficult to apply in large-scale substrate applications. In the downward method, particles descend from the upper portion of the processing space onto the substrate, thus possibly contaminating the substrate. In order to provide for a uniform thickness of the deposited film on a variety of different sizes and types of substrates, the organic material deposition apparatus 100 shown in FIGS. 1-3 may include a chamber 110, a source supply device 130, a stage device 150, and a vacuum forming device 190.

The chamber 110 may be supported by a vibration damping mount 110a that damps vibrations, and may provide a processing space 101 for depositing organic material on a substrate S. The chamber 110 may be separated into an upper chamber 111 and a lower chamber 113. The upper chamber 111 may be supported by a chamber opening module 110b such as, for example, a hydraulic cylinder provided at an edge portion of the lower chamber 113, an elevating screw, or other mechanism as appropriate. The upper chamber 111 may descend toward the lower chamber 113 to seal off the processing space 101, and the upper chamber 111 may be elevated away from the lower chamber 113 to open the processing space 101. In an alternative embodiment, the chamber may instead be provided in an integral configuration having an internal processing space, and a door may be installed at one side surface of such an integral chamber to allow a substrate S and a mask M to be loaded into such a processing space.

The source supply device 130 may vaporize an organic material to be deposited on a substrate S and provide the organic source to the processing space 101. The source supply device 130 may include a source generator 131, a mixer 133, and a dispersion device or deposition device 135 having a structure similar to that of, for example, a shower head or a nozzle. The source generator 131 may be provided outside the processing space 101, and may vaporize an organic material to generate a gaseous organic source. The mixer 133 may mix a transfer gas (for facilitating the transfer of the organic source from the source generator 131 to the processing space 101) with the organic source, and supply the mixture to the shower head 135.

The shower head 135 may be positioned, for example, at the lower portion of the processing space 101 to diffuse and discharge the organic source supplied through the mixer 133 toward the stage device 150. The shower head 135 may include a diffusion room 135a in which the organic source is reflected and diffused by the inner walls (see FIG. 7), and a plurality of injection holes 135b through which the organic source may be discharged, so that the organic source is evenly discharged into the processing space 101.

In alternative embodiments, a heater (not shown) may be provided with the shower head 135 and the chamber 110, to prevent the gaseous organic source from being inadvertently deposited on the shower head 135 and the inner walls of the chamber 110.

The stage device 150 may support a substrate S loaded in the processing space 101, and may attach a mask M, on which a pattern is formed, to the substrate S. The stage device 150 may include a substrate chuck 151, a supporting shaft 153, a flat plate 155, a movement table 157, and a mask movement module 159.

The substrate chuck 151 may be provided at the upper portion of the processing space 101 to support the substrate S loaded in the processing space 101. The substrate chuck 151 may be, for example, an electrostatic chuck (ESC) that holds the substrate S using electrostatic force, and, in alternative embodiments, may include built-in magnets that support the mask M using magnetic force applied proximate to the substrate S attached to the electrostatic chuck. Such a mask M may include magnetic constituents therein.

One end of the supporting shaft 153 may be coupled to the substrate chuck 151 in the processing space 101, and the other end may pass through the top of the upper chamber 111.

In alternative embodiments, a cooling device (not shown) may be provided with the substrate chuck 151 to allow the organic source in a gaseous state to be easily deposited on the substrate S by cooling the substrate S attached to the substrate chuck 151. The cooling device (not shown) may include, for example, a circulation pipe inserted into the substrate chuck 151 to allow a coolant such as cooling water or helium gas supplied along the supporting shaft 153 to be circulated therethrough.

The flat plate 155, which is spaced apart from the upper chamber 111 and parallel with the substrate chuck 151, may be fixed to the other end of the supporting shaft 153. The flat plate 155 may align the substrate S and the mask M longitudinally using an aligning device 173 to be described later.

The movement table 157 may be spaced apart from the upper chamber 111, and disposed between the upper chamber 111 and the flat plate 155. The movement table 157 may include a through hole at the center thereof that the supporting shaft 153 passes through. The movement table 157 may be supported by a chuck movement module 157a such as, for example, a hydraulic cylinder or an elevating screw, that is coupled to an edge portion of the upper chamber 111. The movement table 157 may be installed in such a manner that it can be selectively raised and lowered relative to the upper chamber 111.

The aligning device 173 may be provided between the movement table 157 and the flat plate 155 such that the movement table 157 supports the aligning device 173, and the aligning device 173 supports the flat plate 155. Therefore, the movement table 157 may be raised and lowered by the chuck movement module 157a, thus allowing the substrate chuck 151 to be raised and lowered. In this way, the stage device 150 may adjust a distance between the shower head 135 and the substrate S attached to the substrate chuck 151 because the substrate chuck 151 is raised and lowered as the movement table 157 is raised and lowered.

The mask movement module 159 may include an arm 159a supporting the mask M in the processing space 101, and a driver 159b that raises and lowers the arm 159a toward the substrate chuck 151. The driver 159b may be installed on the movement table 157. The arm 159a may be installed such that it passes through the movement table 157 and the upper chamber 111, and is raised and lowered in the processing space 101. The mask movement module 159 and arm 159a may be provided in plurality so as to support respective edge portions of the mask M by adjusting a position of each arm 159a individually or collectively.

The supporting shaft 153 and the arm 159a may be installed such that they are raised and lowered through the movement table 157 and the upper chamber 111. Accordingly, a sealing member 157b such as, for example, a bellows, may be provided between the upper chamber 111 and the movement table 157 to seal the processing space 101 because the supporting shaft 153 and the arm 159a penetrate therethrough.

Although in the embodiment described above the mask M for forming an organic thin film pattern is transferred into the processing chamber 101, and the stage device 150 includes a mask movement module 159 that adjusts a position of the mask M, in alternative embodiments the mask movement module 159 may be omitted if it is unnecessary to form the organic thin film pattern to be deposited on the substrate S.

A plurality of cameras 171 may be provided on top of the upper chamber 111. The cameras 171 may capture an image of an alignment mark Ma of the mask M through a capture hole 111a that penetrates the upper chamber 111 and an alignment hole Sa formed in the substrate S, thus making it possible to measure an aligned state between the substrate S and the mask M.

The aligning device 173 may move the substrate chuck 151 with respect to the mask M longitudinally, within the plane of substrate chuck 151/substrate S on a plane according to the image captured by the camera 171, thereby aligning the mask M and the substrate S on a plane. The adjustment of the space between the substrate S and the mask M can be performed by individually adjusting a position of the arms 159a. As such, the organic deposition apparatus 100 may align the substrate S and the mask M using the aligning device 173, and may adjust the space between the substrate S and the mask M using the mask movement module 159.

A vacuum forming device 190 may include an upper pumping port 191 provided on the upper chamber 111, and a lower pumping port 193 provided on the lower chamber 113. The upper pumping port 191 and the lower pumping port 193 may be connected to a vacuum pump (not shown) that vacuum exhausts the processing space 101, and may provide an exhaust path to form a vacuum in the sealed processing space 101. Further, the upper and lower pumping ports 191 and 193 may control an air flow direction in the processing space 101 during the vacuum exhaust of the processing space 101.

The upper pumping port 191 may allow the air of the processing space 101 to flow from bottom to top during the injection of an organic source after a vacuum state has been established in the processing space 101. In addition, the upper pumping port 191 may accelerate an elevating speed of the organic source injected through the shower head 135 to thereby reduce a deposition time of the organic source onto the substrate S. This allows the organic source to be conformally deposited onto the substrate S. Furthermore, the upper and lower pumping ports 191 and 193 may perform an exhaust operation to clean the processing space 101 before and/or after deposition of the organic source.

Operation of a substrate attaching apparatus in accordance with an embodiment as broadly described herein will be more fully described with reference to FIGS. 4-7.

In operation S11 (see also FIG. 5), the substrate S is transferred into the processing space 101 in a state in which the upper chamber 111 is elevated and the processing space 101 is opened, and the substrate S may then be attached to the substrate chuck 151. Once the substrate S is attached to the substrate chuck 151, the mask M may be introduced into the processing space 101, with the mask M supported by the arms 159a.

At this time, the camera 171 captures an image of the alignment mark Ma formed in the mask M through the capture hole 111a in the upper chamber 111 and the alignment hole Sa in the substrate S, so that the camera 171 captures an image of the aligned state between the substrate S and the mask M.

If the alignment mark Ma is not aligned with the capture hole 111a and the alignment hole Sa, the mask movement module 159 and the aligning device 173 each performs an alignment between the substrate S and the mask M. That is, the plurality of mask movement modules 159 may operate individually or collectively to raise/lower each edge portion of the mask M, thereby adjusting the space between the mask M and the substrate S. Also, the aligning device 173 may move the flat plate 155 longitudinally within its plane to thereby move the substrate chuck 151 longitudinally within its plane. In this manner, a position of the substrate S with respect to the mask M may be adjusted and controlled.

When the alignment between the substrate S and the mask M is performed, the plurality of mask movement modules 159 may elevate the mask M after equalizing a position of each arm 159a, allowing the mask M to then contact the substrate S.

Thereafter, in operation S13 (see also FIG. 6), the upper chamber 111 descends and the processing space 101 is shielded, or sealed, when the mask M is elevated to contact the substrate S. As the processing space 101 is shielded, the vacuum forming device 190 performs a vacuum exhaust of the processing space.

In operation S15, the vacuum forming device 190 performs the vacuum exhaust of the processing space 101 through both the upper and lower pumping ports 191 and 193. Consequently, by using both the upper and lower pumping ports 191 and 193, it is possible to reduce a vacuum exhaust time of the processing space 101 and increase vacuum efficiency of the processing space 101 because the vacuum exhaust of the processing space 101 is simultaneously performed through the upper and lower pumping ports 191 and 193.

After the vacuum is established in the processing space 101, the movement table 157 is lowered by the chuck movement module 157a. As the movement table 157 descends, the aligning device 173 supported by the movement table 157 descends, and the flat plate 155 supported by the aligning device 173 descends. As the flat plate 155 descends, the supporting shaft 153 descends, and the substrate chuck 151 coupled to the supporting shaft 153 also descends.

Figure 6:
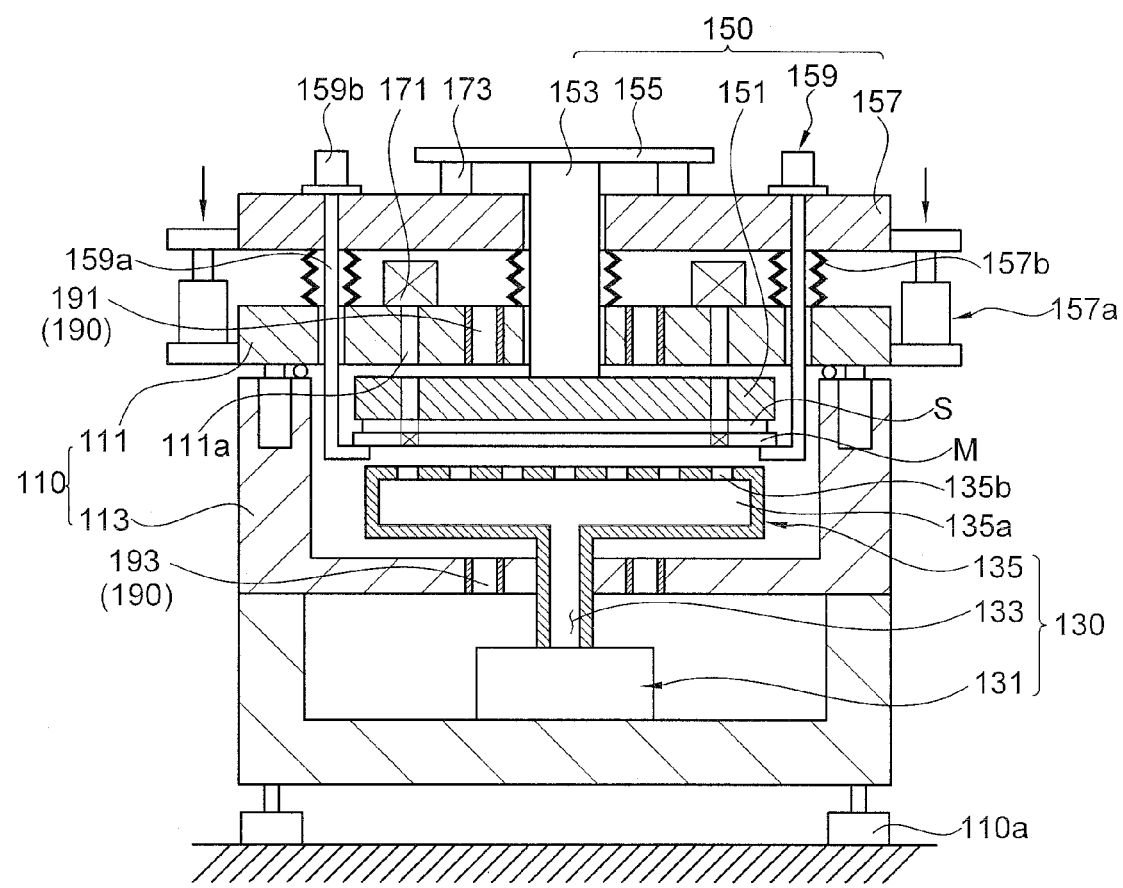

Therefore, as shown in FIG. 6, a distance between the substrate chuck 151 and the shower head 135 is decreased, leading to a decrease in the distance that the organic source injected through the shower head 135 travels to reach the substrate S, thus enhancing the injection efficiency of the organic source.

Figure 7:
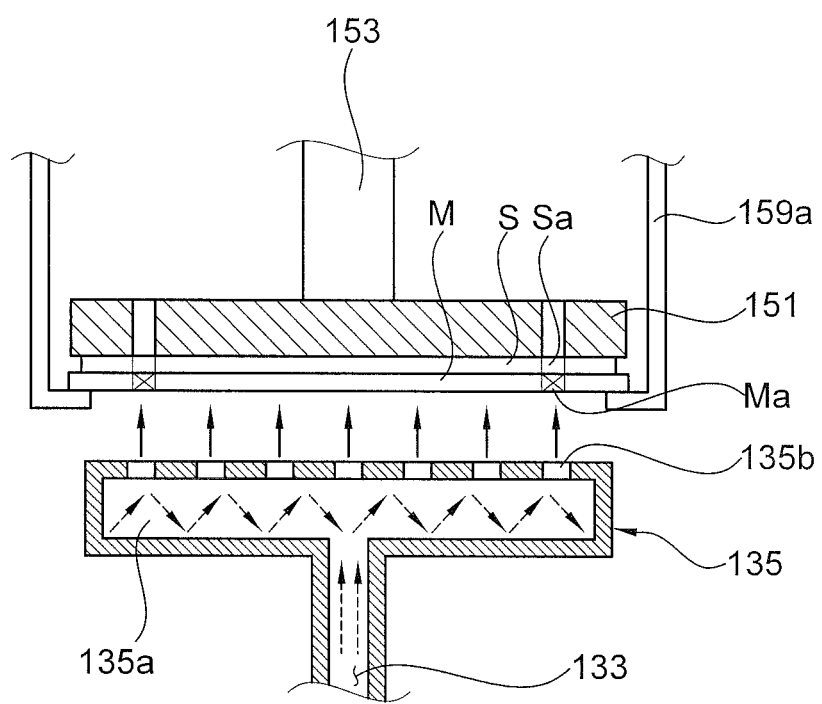

Subsequently, as shown in FIG. 7, the source supply device 130 vaporizes an organic substance stored in the source generator 131, and supplies the vaporized organic source to the mixer 133 provided with a carrier gas. The organic source mixed with the carrier gas in the mixer 133 is supplied to the shower head 135, where it is diffused in the diffusion room 135a, and substantially equally dispersed through the injection holes 135b due to the pressure of the carrier gas supplied to the mixer 133. In certain embodiments, the shower head 135 may be heated by a heater (not shown), so that the organic source is not inadvertently deposited on an inner wall of the shower head 135.

When the organic source is initially dispersed from the shower head 135, the lower pumping port 193 stops performing the vacuum exhaust, but the upper pumping port 191 continues to perform the vacuum exhaust. This, coupled with the pressure of the carrier gas added to the organic source, draws the flow upward through the processing space 101 causing the flow rate of the organic source to be accelerated and deposited onto the substrate S, and making it possible to conformally deposit the organic source on the substrate S. In certain embodiments, the substrate chuck 151 may be cooled by a cooling device (not shown), so that the organic source may be deposited on the substrate S more efficiently.

An organic deposition system and method as embodied and broadly described herein are able to deposit an organic thin film of a uniform thickness using an apparatus with a relatively simple configuration.

An organic deposition system and method as embodied and broadly described herein is also able to easily perform organic thin film deposition on a large-scale substrate.

An organic deposition apparatus and a deposition method using the apparatus are provided, the apparatus and method being capable of depositing an organic thin film with a uniform thickness using an apparatus with a simple configuration.

An organic deposition apparatus as embodied and broadly described herein may include a source supply unit configured to generate an organic source by vaporizing an organic substance to be deposited on a substrate, and configured to inject and diffuse the organic source toward an upper side of the processing space through a shower head disposed at a lower side of the processing space; a stage unit disposed at the upper side of the processing space for supporting the substrate transferred into the processing space and moving the substrate upward and downward to adjust a distance between the substrate and the shower head; and a pumping port disposed at an upper side of the chamber for providing a vacuum exhaust path to the processing space so as to direct an air flow of the processing space toward the stage unit.

The stage unit may include a substrate chuck disposed at the upper side of the processing space for supporting the substrate, and a supporting shaft having one side coupled to the substrate chuck and the other side extending through the upper side of the chamber.

The organic deposition apparatus may also include a flat plate fixed to the other side of the supporting shaft and parallel with the substrate chuck.

The organic deposition apparatus may also include an aligning unit configured to support the flat plate and move the flat plate on a plane.

The stage unit may also include an elevating table disposed between the chamber and the flat plate for supporting the substrate, and a chuck elevating module coupled to a lateral side of the chamber for supporting the elevating table and moving the elevating table upward and downward.

The stage unit may also include a lift arm configured to support a patterned mask in the processing space; and a mask elevating module comprising a lift driving unit configured to move the lift arm toward the substrate chuck.

The mask elevating module may be provided in plurality for supporting an edge portion of the mask, wherein the plurality of mask elevating module may operate individually for adjusting an elevated distance of the lift arm individually.

The organic deposition apparatus may also include a source generator configured to generate an organic source by vaporizing an organic substance, and a mixer disposed between the source generator and the shower head for mixing the organic source generated by the source generator with a carrier gas for carrying the organic source.

The shower head may include a diffusion room configured to diffuse the organic source supplied from the source generator; and a plurality of injection holes extending from the diffusion room to the processing space.

A method of depositing an organic substance as embodied and broadly described herein may include performing a substrate supporting operation for introducing a substrate into a processing space and supporting the substrate; performing a shielding operation for shielding the processing space; performing an exhaust operation for evacuating the processing space through upper and lower sides of the processing space; and performing a deposition operation for injecting an organic source to the substrate after stopping the evacuating of the processing space through the lower side of the processing space while maintaining the evacuating of the processing space through the upper side of the processing space.

Between the substrate supporting operation and the shielding operation, the method may also include performing a mask introducing operation for introducing a patterned mask into the processing space; and performing a contact operation for bringing the mask into contact with the substrate.

The contact operation may include performing a measurement operation for measuring an aligned state between the substrate and the mask; and performing an aligning operation for adjusting a distance between the substrate and the mask by individually moving edge portions of the mask upward and downward, and aligning the substrate with the mask by moving the substrate on a plane with respect to the mask.

Prior to the deposition operation, the method may also include performing a substrate elevating operation for adjusting an injection distance of the organic source by moving the substrate upward and downward.

Any reference in this specification to "one embodiment," "an embodiment," "example embodiment," "certain embodiment," "alternative embodiment," etc., means that a particular feature, structure, or characteristic described in connection with the embodiment is included in at least one embodiment as broadly described herein. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic deposition apparatus, comprising:
    a chamber having a processing space formed therein, the processing space including a first end wall and a second end wall opposite the first end wall;
    a source supply device that generates an organic source and supplies the organic source into the processing space, the source supply device comprising:
        a source generator provided outside the processing space, proximate the second end wall thereof, wherein the source generator vaporizes an organic substance to generate the organic source;
        a dispersion device provided in the processing space, proximate the second end wall thereof; and
        a mixer that extends through the second end wall of the processing space to connect the source generator and the dispersion device such that the dispersion device is separated from the second end wall of the processing space by a corresponding portion of the mixer, wherein a cross sectional area of the dispersion device is greater than a cross sectional area of the mixer;
    a stage device provided proximate the first end wall of the processing space, opposite the dispersion device, wherein the stage device supports a substrate in the processing space and moves the substrate so as to adjust a distance between the substrate and the dispersion device;
    a first port provided through the first end wall of the processing space above the stage device, wherein the first port provides an exhaust path through the processing space that directs flow of the organic source from the dispersion device toward the stage device and out of the processing space; and
    a second port provided through the second end wall of the processing space below the dispersion device.

2. The apparatus of claim 1, wherein the stage device comprises:
    a substrate chuck that supports the substrate; and
    a supporting shaft having a first end that extends out through the first end wall of the processing space, and a second end that is coupled to the substrate chuck.

3. The apparatus of claim 2, wherein the stage device further comprises:
    a plate coupled to the first end of the supporting shaft and oriented in parallel to the substrate chuck;
    a movement table positioned between the chamber and the plate; and a chuck movement module coupled to a lateral side of the chamber, wherein the chuck movement module supports the movement table and moves the movement table upward and downward.

4. The apparatus of claim 2, wherein the stage device further comprises:
   at least one arm that supports a patterned mask in the processing space; and
   at least one corresponding mask movement module comprising at least one driver that moves the at least one arm so as to move the mask relative to the substrate.

5. The apparatus of claim 4, wherein the at least one mask movement module comprises a plurality of mask movement modules that move a corresponding plurality of arms that each support a respective edge portion of the mask, wherein the plurality of mask movement modules operate individually so as to adjust a projection distance of a corresponding arm.

6. The apparatus of claim 1, wherein the mixer mixes the organic source generated by the source generator with a carrier gas that conveys the organic source through the dispersion device and into the processing space.

7. The apparatus of claim 6, wherein the dispersion device comprises:
   a diffusion space that receives and diffuses the organic source from the source generator; and
   a plurality of dispersion holes that extend from the diffusion space into the processing space so as to disperse the organic source into the processing space.

8. The apparatus of claim 1, wherein both the first and the second port are open during a vacuum operation, and wherein the first port remains open and the second port is closed as the organic source supplied into the processing space through the dispersion device so as to direct flow from a second end of the processing space at the second end wall thereof toward a first end of the processing space proximate the first end wall thereof and draw the organic source across the substrate held by the stage device.

9. The apparatus of claim 8, wherein the first end of the processing space is at an upper portion of the chamber, and the second end of the processing space is at a lower portion of the chamber such that the organic source is dispersed into a lower portion of the processing space, and is drawn upward across the substrate toward the open first port.

10. An organic deposition apparatus, comprising:
    a chamber having a processing space formed therein;
    a stage device provided at a first end of the processing space, wherein the stage movably supports a substrate in the processing space;
    a dispersion device provided at a second end of the processing opposite the first end thereof;
    a source generator provided proximate the second end of the processing space, wherein the source generator vaporizes an organic substance to generate the organic source;
    a mixer that connects the source generator and the dispersion device such that the dispersion device is separated from a corresponding end wall of the processing space by a corresponding portion of the mixer, a cross sectional area of the dispersion device being greater than that of the mixer, wherein the dispersion device receives an organic source from the source supply device via the mixer and disperses the organic source into the processing space toward the stage device;
    a first port provided at a first end of the chamber, above the stage device; and
    a second port provided at a second end of the chamber, below the dispersion device, wherein the first port remains open and the second port is closed as the organic source is supplied into the processing space.

11. The apparatus of claim 10, wherein the open first port and the closed second port direct flow from the second end toward the first end of the processing space and draw the organic source across the substrate held by the stage device as the dispersion device supplies the organic source into the processing space.

12. The apparatus of claim 10, wherein the dispersion device comprises:
    a diffusion room that receives and diffuses the organic source from the source supply device; and
    a plurality of dispersion holes that extend from the diffusion room into the processing space so as to disperse the organic source into the processing space.

13. The apparatus of claim 10, wherein the stage device comprises:
    a substrate chuck that supports the substrate;
    a supporting shaft having a first end that extends out through an outer wall of the chamber corresponding to the first end of the processing space, and a second end that is coupled to the substrate chuck;
    a plate coupled to the first end of the supporting shaft and oriented in parallel to the substrate chuck;
    a movement table positioned between the chamber and the plate; and
    a chuck movement module coupled to a lateral side of the chamber, wherein the chuck movement module supports the movement table and moves the movement table upward and downward.

14. The apparatus of claim 13, further comprising:
    at least one arm that extends through the movement table and the outer wall of the chamber corresponding to the first end of the processing space and into the processing space below the substrate chuck, wherein the at least one arm supports a patterned mask in the processing space; and
    at least one corresponding mask movement module coupled to an external end of the at least one arm, the at least one corresponding mask movement module comprising at least one driver that moves the at least one arm so as to move the mask relative to the substrate and independently from the substrate.

* * * * *